(12) United States Patent
Noh (10) Patent No.: US 8,631,756 B2
(45) Date of Patent: Jan. 21, 2014

(54) APPARATUS FOR PROCESSING SUBSTRATE AND METHOD OF MAINTAINING THE APPARATUS

(75) Inventor: Hyoung Rae Noh, Chungcheongnam-do (KR)

(73) Assignee: Semes Co. Ltd. (KR)

( * ) Notice: Subject to any disclaimer, the term of this patent is extended or adjusted under 35 U.S.C. 154(b) by 933 days.

(21) Appl. No.: 12/619,160

(22) Filed: Nov. 16, 2009

(65) Prior Publication Data

US 2010/0122773 A1  May 20, 2010

(30) Foreign Application Priority Data

Nov. 18, 2008  (KR) .................. 10-2008-0114532

(51) Int. Cl.
*C23C 14/22*  (2006.01)
*C23C 14/00*  (2006.01)
*C23C 16/00*  (2006.01)

(52) U.S. Cl.
USPC ............................................. 118/50; 118/715

(58) Field of Classification Search
None
See application file for complete search history.

(56) References Cited

U.S. PATENT DOCUMENTS

| | | | |
|---|---|---|---|
| 5,876,280 A * | 3/1999 | Kitano et al. | 454/187 |
| 6,203,218 B1 * | 3/2001 | Omori et al. | 396/611 |
| 6,293,713 B1 * | 9/2001 | Ueda | 396/611 |
| 6,309,116 B1 * | 10/2001 | Mahara et al. | 396/611 |
| 6,715,943 B2 * | 4/2004 | Nagamine | 396/611 |
| 2001/0024619 A1 * | 9/2001 | Woodruff | 418/142 |
| 2002/0006876 A1 * | 1/2002 | Hongo et al. | 505/191 |
| 2002/0053319 A1 * | 5/2002 | Nagamine | 118/52 |
| 2003/0092261 A1 * | 5/2003 | Kondo et al. | 438/638 |
| 2004/0171269 A1 * | 9/2004 | Kondo et al. | 438/694 |
| 2005/0064703 A1 * | 3/2005 | Kondo et al. | 438/633 |
| 2007/0113977 A1 * | 5/2007 | Hongo et al. | 156/345.31 |

FOREIGN PATENT DOCUMENTS

| | | |
|---|---|---|
| JP | 11-040490 | 2/1999 |
| JP | 2005-087944 | 4/2005 |
| JP | 2005-093769 A | 4/2005 |
| KR | 10-1998-0042482 A | 8/1998 |
| KR | 10-2002-0035758 A | 5/2002 |
| KR | 10-2006-0124882 A | 12/2006 |
| KR | 10-2008-0000876 A | 1/2008 |
| KR | 10-2008-0045803 A | 5/2008 |

\* cited by examiner

*Primary Examiner* — Dah-Wei Yuan
*Assistant Examiner* — Jethro Pence
(74) *Attorney, Agent, or Firm* — Carter, DeLuca, Farrell & Schmidt, LLP (57) ABSTRACT

Provided is an apparatus for processing a substrate. The apparatus includes a chamber, a process unit, and an exhaust member. The chamber has an inner space. The process unit is disposed at the inner space of the chamber and is movable outward from the chamber through a side of the chamber. The process unit includes an exhaust line. The exhaust member is disposed at the chamber. The exhaust member is connected to the exhaust line, and the exhaust member includes a movable exhaust port configured to be moved according to a movement of the process unit.

9 Claims, 9 Drawing Sheets

APPARATUS FOR PROCESSING SUBSTRATE AND METHOD OF MAINTAINING THE APPARATUS

CROSS-REFERENCE TO RELATED APPLICATIONS

This U.S. non-provisional patent application claims priority under 35 U.S.C. §119 of Korean Patent Application No. 10-2008-0114532, filed on Nov. 18, 2008, the entire contents of which are hereby incorporated by reference.

BACKGROUND OF THE INVENTION

The present invention disclosed herein relates to an apparatus for processing a substrate and a method of maintaining the apparatus.

Semiconductor devices are generally manufactured as follows: in a Fab process, electric circuits including electric devices are formed on a silicon wafer used as a semiconductor substrate; in an electrical die sorting (EDS) process, electric characteristics of semiconductor devices formed in the Fab process are inspected; and in a package assembly process, the semiconductor devices are respectively sealed with an epoxy resin and individually packaged.

The Fab process includes sub processes such as a deposition process for forming a film on a wafer, a chemical mechanical polishing (CMP) process for planarizing the film, a photolithography process for forming a photoresist pattern on the film, an etch process for etching the film by using the photoresist pattern to form a pattern having electric characteristics, an ion implantation process for implanting ions into predetermined regions of the wafer, a cleaning process for removing contaminants from the wafer, and an inspection process for inspecting the surface of the wafer on which the film or pattern is formed.

The photolithograph process includes a process of heating the wafer after coating the wafer with the photoresist, a process of heating the wafer after exposing the photoresist, and a process of heating the wafer after developing the photoresist. In addition, the photolithography process includes a cooling process for decreasing the temperature of the wafer after such a heating process.

A photolithography system includes a system constituted by a coating apparatus, a developing apparatus, and a baking apparatus; and a separate system for performing an exposing process. To use the space of equipment efficiently, the coating apparatus, the developing apparatus, and the baking apparatus of the photolithography system are arranged in multiple stages.

However, such a multi-stage structure makes it difficult to ensure a space necessary for repairing the inside of a processing apparatus, and thus it is difficult to perform a maintenance work.

SUMMARY OF THE INVENTION

The present invention provides a substrate processing system configured to ensure a space for a maintenance work.

The present invention also provides a substrate processing system, in which a maintenance work can be easily performed on a substrate processing apparatus having a multi-stage structure and exhaust is possible during the maintenance work.

The present invention also provides a substrate processing system, in which exhaust is possible while a maintenance work is performed on a substrate processing apparatus having a drawer structure.

The present invention also provides a substrate processing system, in which a maintenance work can be easily performed to reduce maintenance time and system downtime and improve production efficiency.

The present invention is not limited to the aforesaid, but other facts not described herein will be clearly understood by those skilled in the art from descriptions below.

Embodiments of the present invention provide apparatuses for processing a substrate, the apparatus including: a chamber including an inner space; a process unit disposed at the inner space of the chamber and movable outward from the chamber through a side of the chamber, the process unit including an exhaust line; and an exhaust member disposed at the chamber, wherein the exhaust member is connected to the exhaust line, and the exhaust member includes a movable exhaust port configured to be moved according to a movement of the process unit.

In some embodiments, the exhaust member may further include an exhaust duct including a slit-shaped opening, and the movable exhaust port may be movable along the opening.

In other embodiments, the exhaust member may further include: a sealing belt configured to be moved together with the movable exhaust port and seal the opening; and guide rollers disposed close to one side and the other side of the opening for guiding movement of the sealing belt.

In even other embodiments, the exhaust duct may be disposed at a side of the chamber, and a length direction of the exhaust duct may be parallel with a moving direction of the process unit.

In yet other embodiments, the process unit may further include: a substrate supporting member including a spin head configured to receive a substrate thereon; and a process vessel surrounding the spin head to collect a process fluid floating from a substrate.

In further embodiments, the chamber may further include: a guide rail disposed along a moving direction of the process unit; and a movable base configured to be moved along the guide rail, wherein the process unit may be disposed at the movable base.

In still further embodiments, the chamber may further include: a first side including a substrate port; a second side opposite to the first side; and third and fourth sides connecting the first and second sides, wherein the second side may be configured to be opened by moving a door to provide an opened side for moving the process unit outward through the opened side.

In other embodiments of the present invention, there are provided apparatuses for processing a substrate, the apparatuses including: a chamber including an inner space; a process unit disposed at the inner space of the chamber and movable between first and second relative positions to the chamber; and a movable exhaust port movable to a first position at which the movable exhaust port is connected to the process unit placed at the first relative position and to a second position at which the movable exhaust port is connected to the process unit placed at the second relative position.

In some embodiments, the process unit may be accommodated in the inner space of the chamber at the first relative position and may be placed outward from the chamber at the second relative position for a maintenance work.

In other embodiments, the apparatus may further include an exhaust duct connected to an external main exhaust line and in which an opening is formed as a passage along which the movable exhaust port is movable between the first and second positions.

In still other embodiments, the apparatus may further include: a sealing belt configured to be moved together with the movable exhaust port and seal the opening; and guide rollers disposed close to one side and the other side of the opening for guiding movement of the sealing belt.

In yet other embodiments, the apparatus may further include: a guide rail disposed at the chamber in a moving direction of the process unit; and a movable base configured to be moved along the guide rail, wherein the process unit is disposed at the movable base.

In still other embodiments of the present invention, there are provided apparatuses for processing a substrate, the apparatuses including: a chamber including an inner space and an opened side configured to be closed and opened by a door; a movable base disposed at the inner space of the chamber and movable through the opened side of the chamber; a process vessel disposed at the movable base to surround a spin head on which a substrate is placed, so as to collect a process fluid floating from the substrate; an exhaust line connected to the process vessel; and an exhaust duct connected to the exhaust line and at which a movable exhaust port is disposed, the movable exhaust port is movable in the same direction as the movable base.

In some embodiments, the chamber may be divided into an upper space and a lower space by the movable base, and the exhaust duct is fixed to the lower space.

In other embodiments, the exhaust duct may include: a slit-shaped opening at which the movable exhaust port is movably disposed; and a sealing belt configured to be moved together with the movable exhaust port and seal the opening.

In still other embodiments, the apparatus may further include: guide rollers disposed close to one side and the other side of the opening for guiding movement of the sealing belt.

In even other embodiments of the present invention, there are provided methods of maintaining a substrate processing apparatus including a process unit and a movable exhaust port, the process unit being movable between first and second relative positions to a chamber, the movable exhaust port being connected to the process unit through an exhaust line and being movable on an exhaust duct according to movement of the process unit, the method including: moving the process unit from the first relative position to the second relative position; and allowing the movable exhaust port to be moved along the exhaust duct from a first position to a second position according to the moving of the process unit.

In some embodiments, the movable exhaust port may be allowed to be moved from the first position which is located at an end of an opening formed in the exhaust duct to the second position which is located at the other end of the opening.

In other embodiments, when the movable exhaust port is moved, the opening of the exhaust duct may be sealed by a sealing belt which is moved together with the movable exhaust port.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

An apparatus for processing a substrate and a method of maintaining the apparatus will now be described with reference to the accompanying drawings according to embodiments of the present invention. In the drawings, like reference numerals refer to like elements throughout. In the following description, well-known processes, well-known device structures, and well-known techniques will not be described in detail to avoid ambiguous interpretation of the present invention.

(Embodiment)

In the current embodiment, a semiconductor substrate is illustrated and explained as an example of substrates that can be processed using a substrate processing apparatus 1. However, the present invention is not limited thereto. That is, the present invention can be applied to various substrates such as a glass substrate.

Figure 1:
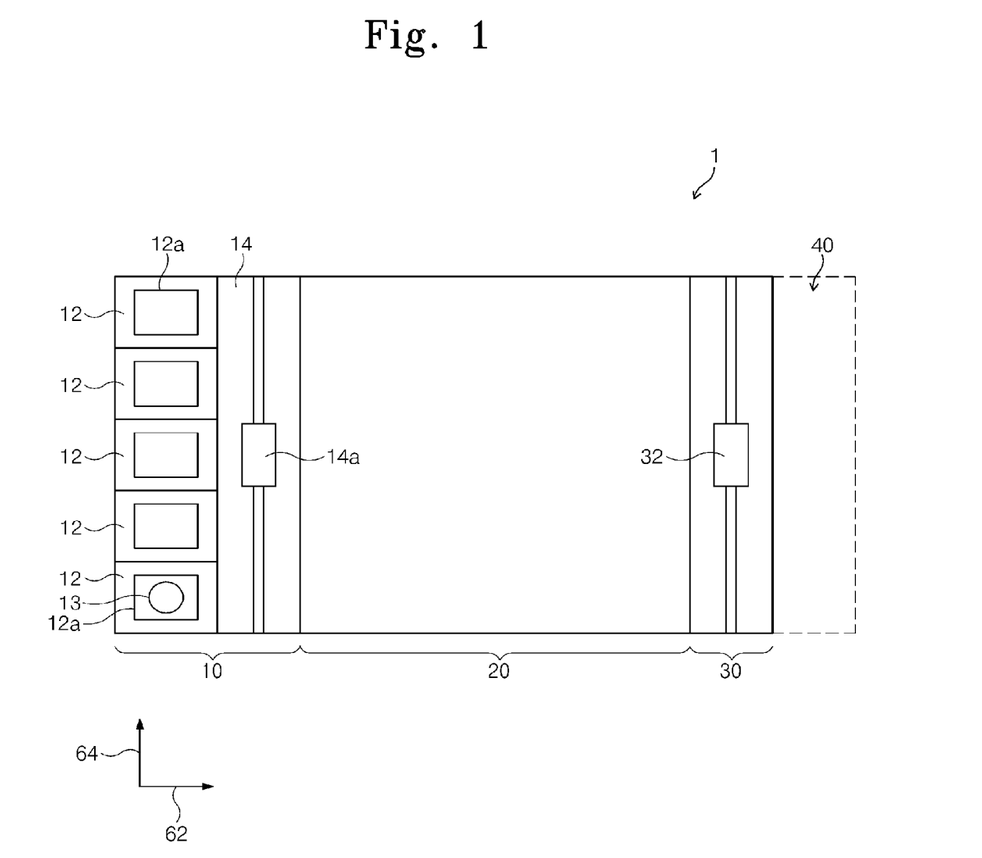
FIG. 1 is a schematic view illustrating an apparatus for processing a substrate according to an embodiment of the present invention.

FIG. 1 is a schematic view illustrating a substrate processing apparatus 1 according to an embodiment of the present invention. The substrate processing apparatus 1 is used to perform a photolithography process on a wafer.

Referring to FIG. 1, the substrate processing apparatus 1 includes an index part 10, a process part 20, and an interface part 30, which are sequentially disposed in one direction (hereinafter, referred to as a first direction 62) in parallel with each other. The index part 10 includes cassette stages 12 and a robot passage 14.

Cassettes 12a in which semiconductor substrates such as wafers are accommodated are placed on the cassette stages 12. A robot 14a is disposed on the robot passage 14 for carrying wafers between the cassettes 12a placed on the cassette stages 12 and process part 20. The robot 14a is capable of moving on a horizontal plane in the above-described first direction 62 and a vertical direction (hereinafter, referred as a second direction 64), and the robot 14a is capable of moving in a vertical direction. The horizontal and vertical movement structure of the robot 14a will be apparent to those of ordinary skill in the related art, and thus a detailed description thereof will be omitted.

The process part 20 is used to perform a coating process for coating a wafer with a photosensitive material such as photoresist and a developing process for removing exposed or non-exposed regions of the photoresist from the wafer after an exposing process is performed on the wafer. The process part 20 includes coating units 70, development units 80, and bake units 50 (refer to FIG. 2).

The interface part 30 connected to an exposing part 40 is disposed at a side of the process part 20. A robot 32 is disposed at the interface part 30 for carrying wafers between the exposing part 40 and the process part 20. The robot 32 is capable of moving in the second direction 64 and the vertical direction.

Figure 2:
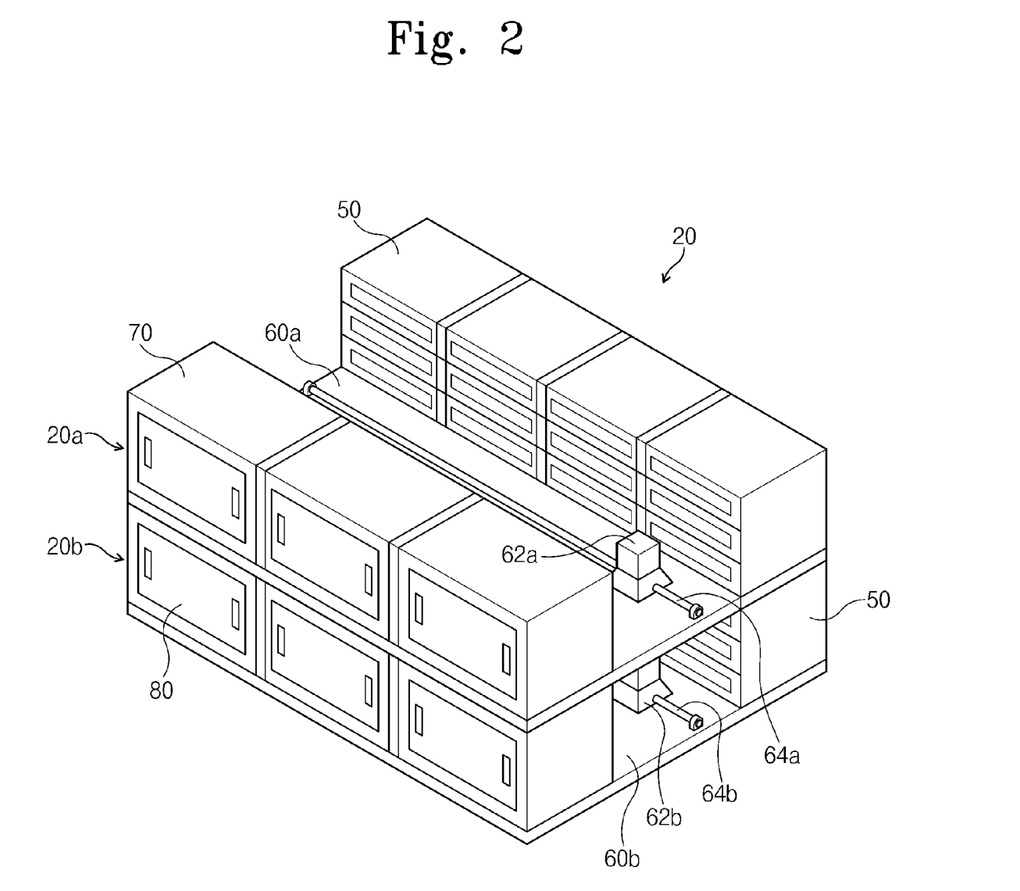
FIG. 2 is a perspective view illustrating a process part of the substrate processing apparatus illustrated in FIG. 1, according to an embodiment of the present invention.

FIG. 2 is a perspective view illustrating example of the process part 20.

The process part 20 includes a first process chamber 20a and a second process chamber 20b. The first and second process chambers 20a and 20b are stacked one after another. At the first process chamber 20a, units are disposed for performing a coating process, and at the second process chamber 20b, units are disposed for performing a developing process. That is, the coating units 70 and the bake units 50 are disposed at the first process chamber 20a, and the development units 80 and the bake units 50 are disposed at the second process chamber 20b. For example, the first process chamber 20a is disposed at the top side of the second process chamber 20b. Alternatively, the first process chamber 20a may be disposed at the bottom side of the second process chamber 20b.

In the above-described structure, wafers are sequentially moved through the index part 10, the first process chamber 20a, the interface part 30, the exposing part 40, the interface part 30, the second process chamber 20b, and the index part 10. That is, during a photolithography process, wafers are moved along the upper side and the lower side in a loop-shaped pass.

Figure 3:
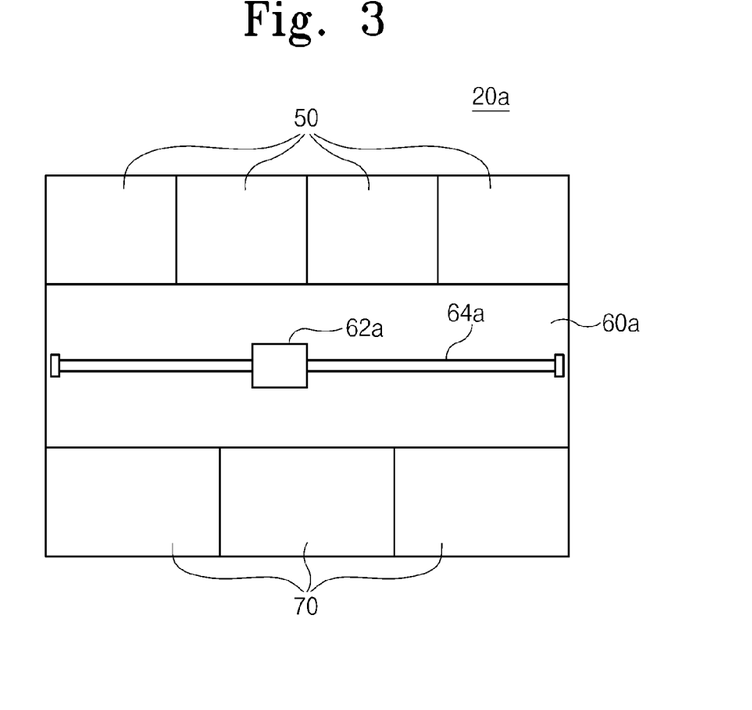
FIG. 3 is a plan view illustrating a first process chamber of the process part illustrated in FIG. 2, according to an embodiment of the present invention.

FIG. 3 is a plan view of the first process chamber 20a.

Referring to FIG. 3, a first passage 60a extends lengthwise along the center part of the first process chamber 20a in the first direction 62. An end of the first passage 60a is connected to the index part 10, and the other end of the first passage 60a is connected to the interface part 30. The bake units 50 are arranged in a row along a side of the first passage 60a, and the coating units 70 are arranged in a row along the other side of the first passage 60a. The bake units 50 and the coating units 70 are vertically stacked. A first robot 62a is disposed at the first passage 60a for carrying wafers among the interface part 30, the coating units 70, the bake units 50, and the index part 10. A guide rail 64a is disposed at the first passage 60a so that the first robot 62a can move straight in the first direction 62.

For example, the bake units 50 of the first process chamber 20a includes a bake unit used to perform a pre-baking process for heating a substrate to a predetermined temperature to remove organic substances or moisture from the substrate before coating the substrate with photoresist, a bake unit used to perform a soft-baking process after coating the substrate with photoresist, and a bake unit used to perform a process of cooling the substrate.

Figure 4:
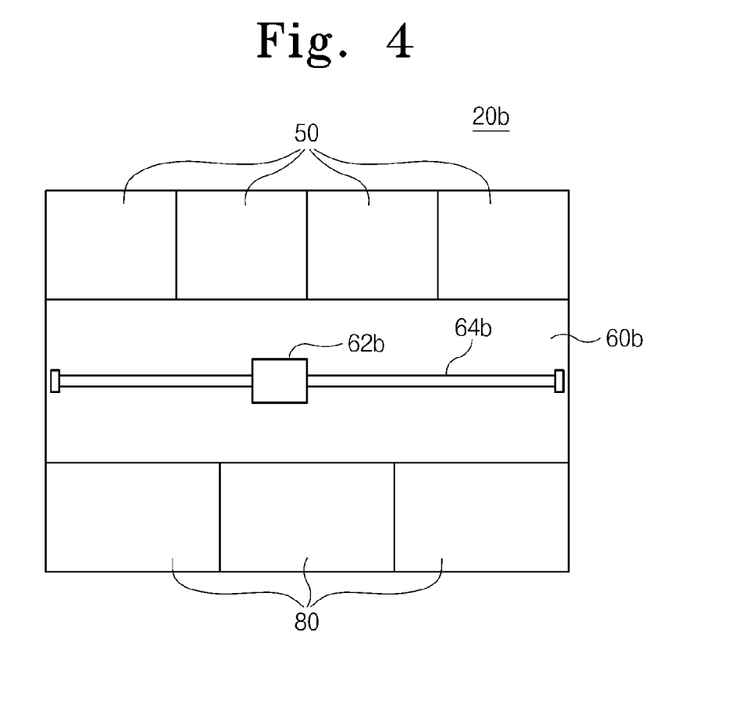
FIG. 4 is a plan view illustrating a second process chamber of the process part illustrated in FIG. 2, according to an embodiment of the present invention.

FIG. 4 is a plan view illustrating the second process chamber 20b.

Referring to FIG. 4, a second passage 60b extends lengthwise along the center part of the second process chamber 20b in the first direction 62. An end of the second passage 60b is connected to the index part 10, and the other end of the second passage 60b is connected to the interface part 30. The bake units 50 are arranged in a row along a side of the second passage 60b, and the development units 80 are arranged in a row along the other side of the second passage 60b. The bake units 50 and the development units 80 are vertically stacked. A second robot 62b is disposed at the second passage 60b for carrying wafers among the interface part 30, the development units 80, the bake units 50, and the index part 10.

For example, the bake units 50 of the second process chamber 20b includes a bake unit used to perform a hard-baking process after developing photoresist which is changed by exposure to light, a bake unit used to perform a post exposure process after photoresist is exposed to a light source, and a bake unit used to perform a substrate cooling process.

A guide rail 64b is disposed at the second passage 60b so that the second robot 62b can move straight in the first direction 62. Unlike the above-described structure, a first passage may be provided at a side of a first process chamber, and coating units and bake units may be disposed at the other side of the first process chamber; and a second passage may be provided at a side of a second process chamber, and development units and bake units may be disposed at the other side of the second process chamber.

Figure 5:
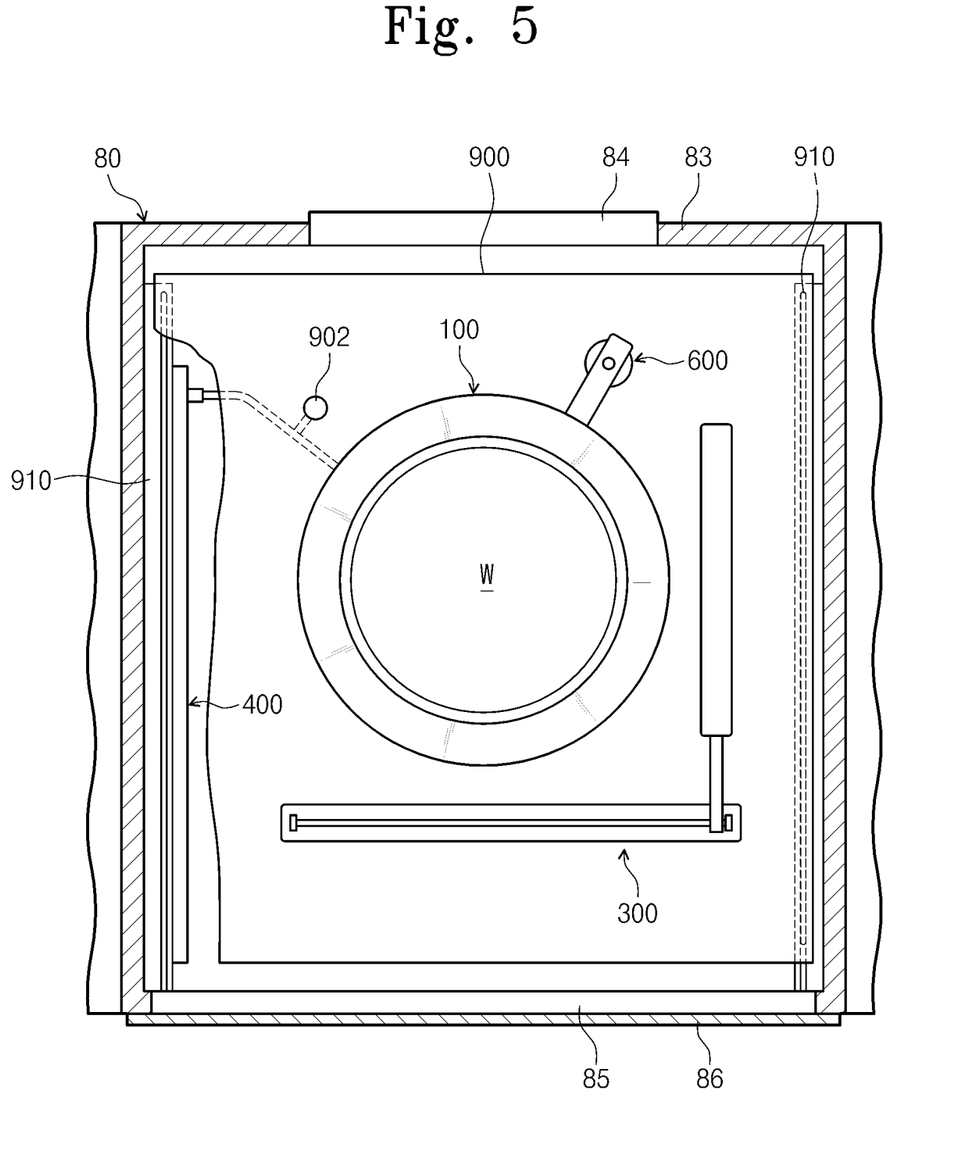
FIGS. 5 and 6 are a plan view and a side sectional view illustrating a development unit according to an embodiment of the present invention.
Figure 6:
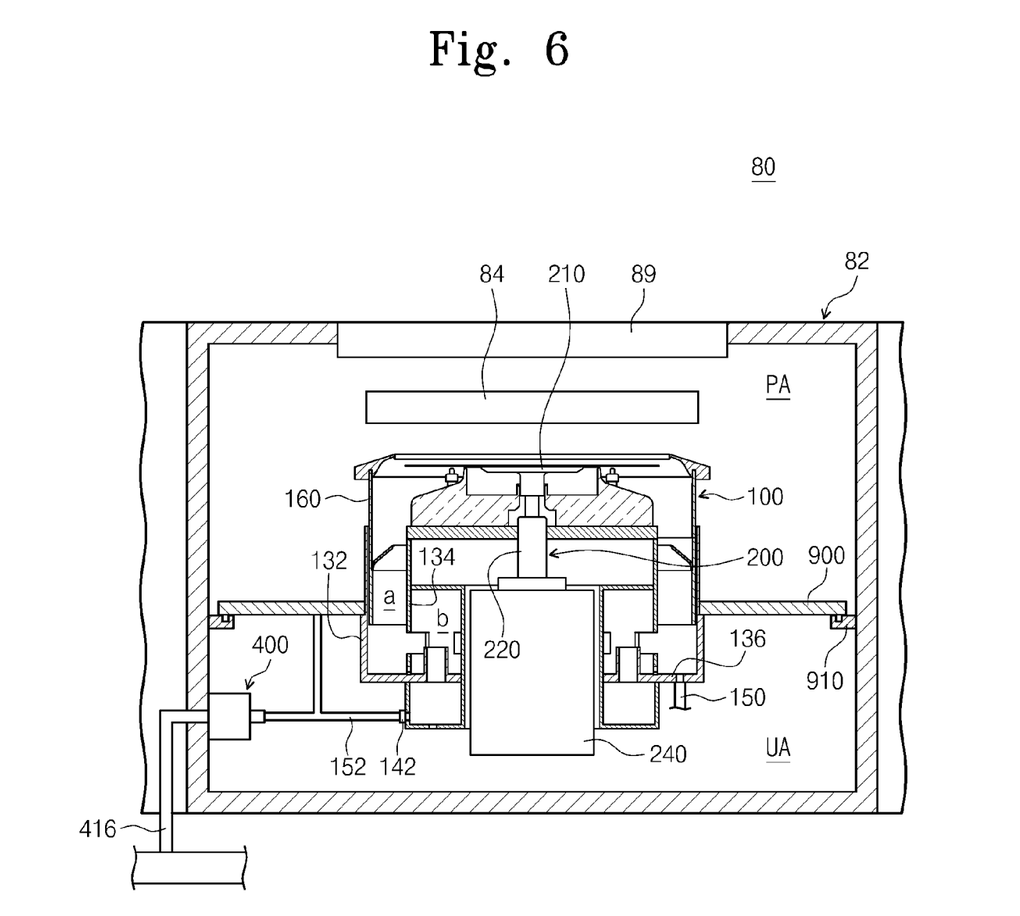

FIGS. 5 and 6 are a plan view and a side sectional view illustrating the development unit 80. In the current embodiment, the development unit 80 is explained as an example. However, the current embodiment can be applied to a coating unit, or a cleaning/etching unit used to remove contaminants and films remaining on a substrate by using various processing fluids. In FIG. 6, a nozzle member is not illustrated for clarity.

Referring to FIGS. 5 and 6, the development units 80 includes a chamber 82, a process vessel 100, a substrate supporting member 200, a nozzle member 300, and an exhaust member 400.

The chamber 82 provides a closed inner space, and a fan filter unit 89 is disposed at an upper side of the chamber 82. The fan filter unit 89 creates a vertical air stream in the chamber 82. A substrate port 84 is formed in a first side 83 of the chamber 82 adjacent to the second passage 60b, and a side of the chamber 82 opposite to the first side 83 where the substrate port 84 is formed is opened as an opened side 85. The opened side 85 is closed by a cover 86.

In the fan filter unit 89, a filter and an air supply fan are disposed as a module in order to supply clean air to the inside of the chamber 82 after filtering. Clean air is supplied to the inside of the chamber 82 through the fan filter unit 89, and a vertical air stream is formed by the clean air. The vertical air stream forms uniform air streams on the top of a substrate. Air is exhausted from the inside of the chamber 82 to the outside through an exhaust line 152 connected to the process vessel 100, a suction port disposed at a movable base 900, and an exhaust duct disposed in a utility area (UA), so that the surrounding area of the process vessel 100 can be kept at a highly clean state.

As shown in FIG. 6, the chamber 82 is divided into a process area (PA) and the utility area (UA) by the movable base 900. The movable base 900 can be moved along guide rails 910 installed on the chamber 82 and drawn from the chamber 82 through the opened side 85 to a maintenance position (refer to FIG. 10). The process vessel 100 and the nozzle member 300 are installed on the movable base 900, and the process vessel 100 and the nozzle member 300 are moved from a process position (a first state shown in FIG. 5) to the maintenance position (a second state shown in FIG. 10) together with the movable base 900. Although not fully illustrated in FIG. 6, a driving unit of an elevating unit 600, and various pipes connected to the nozzle member 300, as well as a discharge line and the exhaust line 152 connected to the process vessel 100, are disposed in the utility area (UA). Therefore, the process area (PA) may be isolated from the utility area (UA) for keeping the process area (PA) at a highly clean state.

The process vessel 100 is disposed on the movable base 900. The process vessel 100 has a cylindrical shape with an opened top side, and a process space is formed in the process vessel 100 for processing a substrate (w). A substrate (w) is loaded into and unloaded from the process vessel 100 through the opened top side of the process vessel 100.

The process vessel 100 surrounds the substrate supporting member 200. While a developing, cleaning, or drying process is performed on a substrate (w), the substrate (w) is rotated, and fluids (such as a developer, a cleaning solution, and drying gas) floating from the rotating substrate (w) are collected in the process vessel 100. Therefore, external devices or the surrounding environment can be kept clean. In addition, a developer can be collected for reuse, and a uniform air stream can be formed above the substrate (w).

The process vessel 100 includes an outer space (a) and an inner space (b). A developer and gas floating from a substrate (w) are introduced to the outer space (a), and the outer space (a) is formed by an outer wall 132 and a vertical barrier wall 134. A drain port 150 is formed in a bottom side 136 of the outer space (a) for draining a developer. An exhaust port 142 is formed in a bottom side of the inner space (b) for exhausting gas. An exhaust line 152 is connected to the exhaust port 142 of the process vessel 100 for forcible gas exhaust. The exhaust line 152 is connected to a movable exhaust port of the exhaust member 400.

A vertically movable ring-shaped cover 160 is disposed at the outer wall 132 of the process vessel 100. The cover 160 is vertically moved by the elevating unit 600 when a substrate (w) is loaded on a spin head 210 or a processed substrate (w) is unloaded. The elevating unit 600 vertically moves the cover 160 between an up-position higher than a substrate position and a down-position lower than the substrate position.

The elevating unit 600 moves the process vessel 100 linearly in a vertical direction. As the process vessel 100 is vertically moved, the height of the process vessel 100 relative to the spin head 210 is varied. The elevating unit 600 includes a bracket, a movable shaft, and a driver. The bracket is fixed to an outer wall of the process vessel 100, and the movable shaft that can be vertically moved by the driver is fixed to the bracket. When a substrate (w) is loaded on or unloaded from the spin head 210, the cover 160 is moved downward so that the spin head 210 protrudes from the top side of the process vessel 100.

In the substrate processing apparatus 1 of the current embodiment, the process vessel 100 is vertically moved to vary the vertical position of the process vessel 100 relative to the substrate supporting member 200. Alternatively, the substrate supporting member 200 may be vertically moved to vary the vertical position of the process vessel 100 relative to the substrate supporting member 200.

The substrate supporting member 200 is disposed inside the process vessel 100. The substrate supporting member 200 is used to support a substrate (w) during a process, and if necessary, the substrate supporting member 200 can be rotated by a driver 240 (described later) during a process. The substrate supporting member 200 includes the spin head 210, and the top side of the spin head 210 is flat to receive a substrate (w) thereon. To prevent a substrate (w) from being moved off the spin head 210 due to a centrifugal force, the substrate (w) may be vacuum-attached to the spin head 210 by using a vacuum line (not shown) formed in the spin head 210. Unlike this, the lateral edge of a substrate (w) can be fixed by using chucking pins installed at the spin head 210. A spindle 220 is fixed to the bottom side of the spin head 210, and the spindle 220 is configured to be rotated by the driver 240. The driver 240 includes a motor (not shown), a belt (not shown), and a pulley (not shown).

The nozzle member 300 is disposed outside the process vessel 100. The nozzle member 300 supplies process fluids to a substrate (w) fixed to the substrate supporting member 200 for performing developing, cleaning, and drying processes on the substrate (w).

Figure 7:
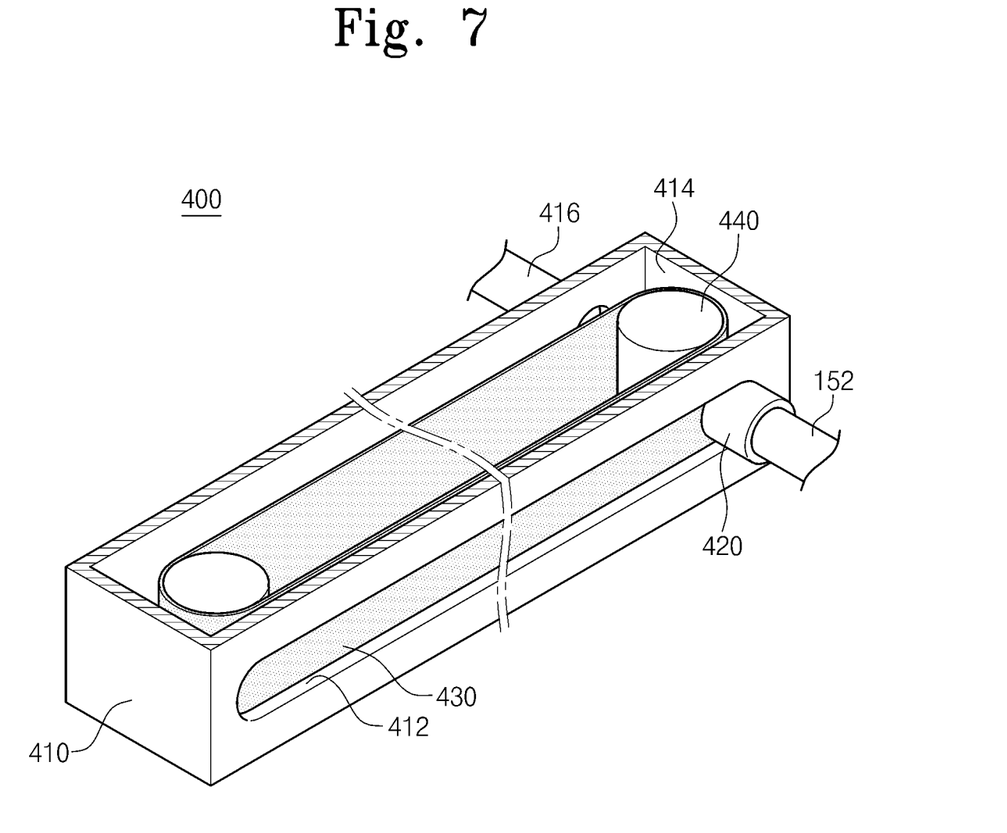
FIG. 7 is a perspective view illustrating an exhaust member according to an embodiment of the present invention.
Figure 8:
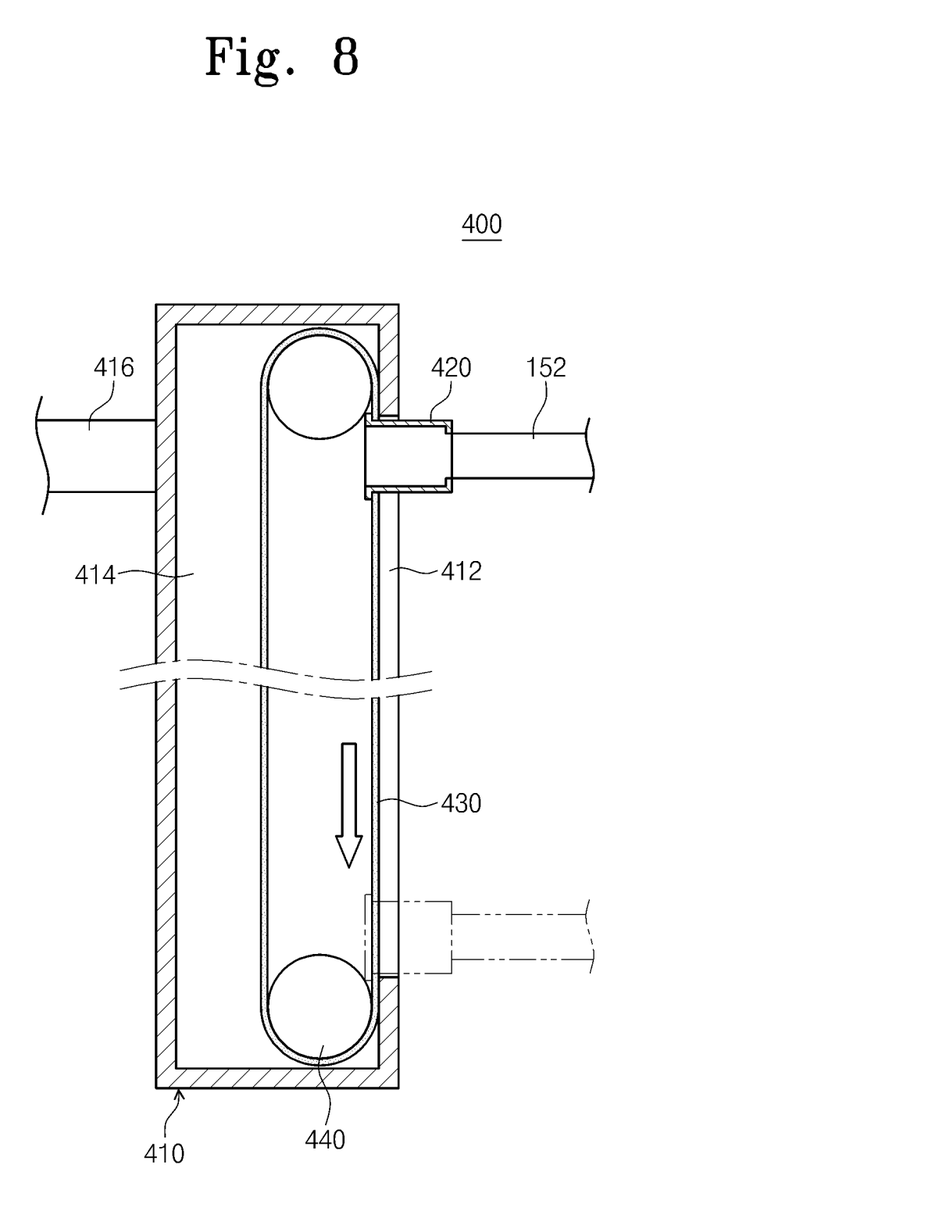
FIG. 8 is a plan sectional view illustrating the exhaust member according to an embodiment of the present invention.
Figure 9:
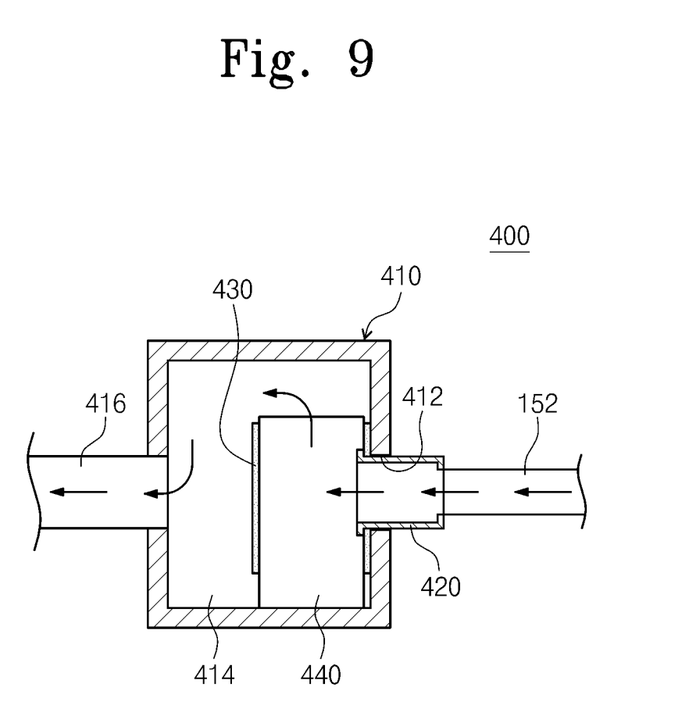
FIG. 9 is a side sectional view illustrating the exhaust member according to an embodiment of the present invention.

FIG. 7 is a perspective view illustrating the exhaust member 400, FIG. 8 is a plan sectional view illustrating the exhaust member 400, and FIG. 9 is a side sectional view illustrating the exhaust member 400.

Referring to FIGS. 6 through 9, the exhaust member 400 creates an exhaust pressure (suction pressure) for sucking air introduced into the process vessel 100 during a process and air from the upper side of the chamber 82. The exhaust member 400 includes an exhaust duct 410, a movable exhaust port 420, a sealing belt 430, and guide rollers 440.

The exhaust duct 410 is fixed to a side of the utility area (UA). An exhaust pressure is applied to the exhaust duct 410 from an exhaust pump (not shown), and the exhaust duct 410 is connected to a main exhaust line 416 buried in the floor of a semiconductor production line (factory). The length direction of the exhaust duct 410 is parallel with the moving direction of the movable base 900, and the length of the exhaust duct 410 may be greater than the moving distance of the movable base 900. A slit-shaped opening 412 is formed in a side of the exhaust duct 410. The length of the opening 412 may be at least the same as the moving distance of the movable base 900.

The movable exhaust port 420 is disposed on the opening 412 and is connected to the exhaust line 152. The movable exhaust port 420 is configured to be moved along the opening 412 according to the movement of the movable base 900.

The sealing belt 430 is provided for sealing the opening 412. The movable exhaust port 420 is disposed at the sealing belt 430. The sealing belt 430 and the movable exhaust port 420 are configured to be moved together. The sealing belt 430 slides in a state where the sealing belt 430 makes contact with an inner side of the exhaust duct 410 where the opening 412 is formed. The guide rollers 440 are close to both sides of the opening 412, respectively, and used to guide the movement of the sealing belt 430.

Figure 10:
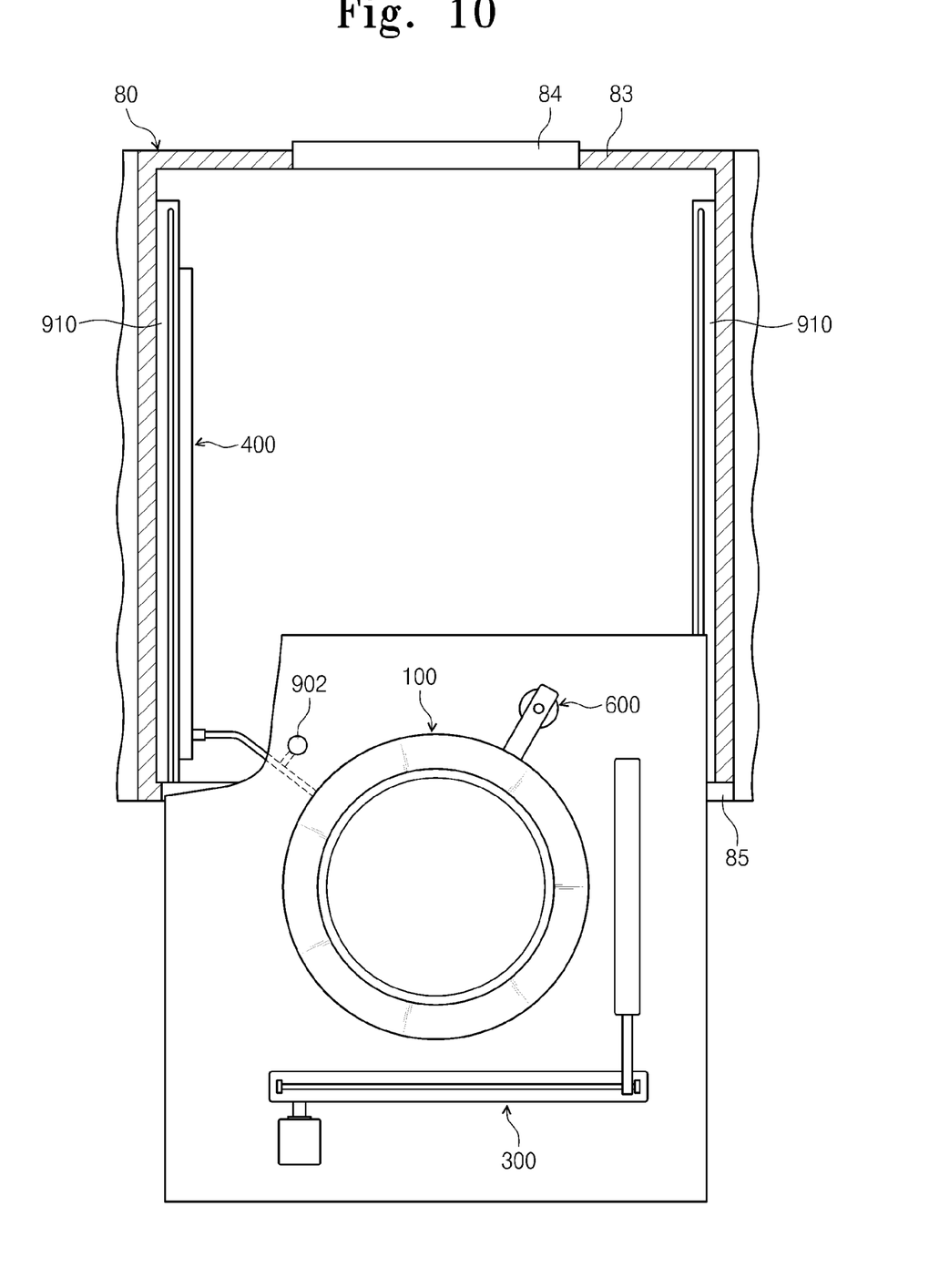
FIG. 10 is a plan view illustrating a movable base drawn out for maintaining a process vessel according to an embodiment of the present invention.

FIG. 10 is a plan view illustrating the process vessel 100 drawn from the chamber 82 for a maintenance work.

For a maintenance work on the process vessel 100 or the nozzle member 300, first, the cover 86 is detached from the opened side 85 of the chamber 82, and the movable base 900 is pulled out through the opened side 85 so as to draw the movable base 900 along the guide rails 910 to the outside of the chamber 82. At this time, the movable exhaust port 420 of the exhaust member 400 connected to the exhaust line 152 of the process vessel 100 is also moved along the opening 412 by a distance corresponding to the moved distance of the movable base 900. That is, the joint point between the movable exhaust port 420 and the exhaust line 152 is moved from a first position (an end of the opening 412 close to the substrate port 84) corresponding to a position of the process vessel 100 in the process vessel 100 to a second position (the other end of the opening 412 close to the opened side 85) corresponding to a position of the process vessel 100 outside the chamber 82.

As shown in FIG. 10, although the process vessel 100 is taken out from the chamber 82 for a maintenance work, the exhaust line 152 of the process vessel 100 is not disconnected from the movable exhaust port 420 of the exhaust member 400, so that an exhaust pressure can be continuously applied to the inside of the process vessel 100. Therefore, while a maintenance work is performed on the process vessel 100, the process vessel 100 can be minimally contaminated because non-clean air (containing particles) can be forcibly exhausted from the inside of the process vessel 100 owing to an exhaust pressure applied to the inside of the process vessel 100. Particularly, since the exhaust line 152 is connected to a suction hole 902 of the movable base 900 as well as the inside of the process vessel 100, an exhaust pressure can also be applied to an upper area of the movable base 900.

According to the present invention, a space for a maintenance work can be ensured.

Furthermore, according to the present invention, a maintenance work can be easily performed on a substrate processing apparatus having a multi-stage structure, and exhaust is possible during the maintenance work.

In addition, according to the present invention, exhaust is possible during a maintenance work on a substrate processing apparatus having a drawer structure.

In addition, according to the present invention, since a maintenance work can be easily performed, maintenance time and system downtime can be reduced, and production efficiency can be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for processing a substrate, comprising:
    a chamber comprising an inner space;
    a process vessel disposed at the inner space of the chamber and movable outward from the chamber through a side of the chamber, the process vessel comprising an exhaust line; and
    an exhaust member disposed at the chamber,
    wherein the exhaust member comprises a movable exhaust port that is connected to the exhaust line,
    wherein a joint point between the movable exhaust port and the exhaust line moves according to a movement of the process vessel, and
    wherein the exhaust member and the exhaust line are continuously connected to each other when the process vessel is taken out from the chamber and during maintenance work of the apparatus.

2. The apparatus of claim 1, wherein the exhaust member further comprises an exhaust duct comprising a slit-shaped opening, and the movable exhaust port is movable along the slit-shaped opening.

3. The apparatus of claim 2, wherein the exhaust member further comprises a sealing belt configured to move together with the movable exhaust port and seal the slit-shaped opening.

4. The apparatus of claim 3, wherein the exhaust member further comprises guide rollers configured to guide a movement of the sealing belt along the slit-shaped opening.

5. The apparatus of claim 2, wherein the exhaust duct is disposed at a side of the chamber, and a length direction of the exhaust duct is parallel with a moving direction of the process vessel.

6. The apparatus of claim 1,
    wherein the process vessel further comprises a substrate supporting member comprising a spin head configured to receive a substrate thereon, and
    wherein the process vessel surrounds the spin head to collect a process fluid floating from the substrate.

7. The apparatus of claim 1, wherein the chamber further comprises:
    a guide rail disposed along a moving direction of the process vessel; and
    a movable base configured to move along the guide rail,
    wherein the process vessel is disposed at the movable base.

8. The apparatus of claim 1, wherein the chamber further comprises:
    a first side comprising a substrate port;
    a second side opposite to the first side; and
    third and fourth sides connecting the first and second sides,
    wherein the second side is configured to be opened by moving a door to provide an opening for moving the process vessel outward through the opening.

9. The apparatus of claim 1, wherein the exhaust member continuously creates the exhaust pressure to the inside of the process vessel when the process vessel is taken out from the chamber and during maintenance work of the apparatus.

* * * * *